US005618653A

United States Patent [19]
Vaes et al.

[11] Patent Number: 5,618,653
[45] Date of Patent: Apr. 8, 1997

[54] KIT FOR PREPARING A PROCESSING LIQUID FOR USE IN THE PREPARATION OF A LITHOGRAPHIC PRINTING PLATE ACCORDING TO THE SILVER SALT DIFFUSION TRANSFER PROCESS

[75] Inventors: Jos Vaes, Betekom; Renaat Ceulemans, Ranst, both of Belgium

[73] Assignee: Agfa-Gevaert N.V., Mortsel, Belgium

[21] Appl. No.: 617,385

[22] Filed: Mar. 18, 1996

[30] Foreign Application Priority Data

Mar. 21, 1995 [EP] European Pat. Off. .............. 95200692

[51] Int. Cl.⁶ ..................................................... G03C 5/50
[52] U.S. Cl. ........................... 430/250; 430/249; 430/465
[58] Field of Search .................................. 430/249, 250, 430/465

[56] References Cited

U.S. PATENT DOCUMENTS 4,649,096  3/1987  Tsubai et al. .......................... 430/249
5,204,230  4/1993  Hayashi ................................. 430/465

*Primary Examiner*—Hoa Van Le
*Attorney, Agent, or Firm*—Brumbaugh, Graves, Donohue & Raymond

[57] ABSTRACT

The present invention provides a kit for preparing a processing liquid for use in the preparation of a lithographic printing plate according to the silver salt diffusion transfer process, and comprising all necessary active compounds for preparing said processing liquid, said active compounds including a hydrophobizing agent being provided on the surface of solid particles, said solid particles being soluble in said processing liquid.

8 Claims, No Drawings

KIT FOR PREPARING A PROCESSING LIQUID FOR USE IN THE PREPARATION OF A LITHOGRAPHIC PRINTING PLATE ACCORDING TO THE SILVER SALT DIFFUSION TRANSFER PROCESS

DESCRIPTION

1. Field of the Invention

The present invention relates to a kit for preparing a processing liquid for use in preparing a lithographic printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and the book "Photographic Silver Halide Diffusion Processes" by André Rott and Edith Weyde —The Focal Press—London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

In order to prepare a lithographic printing plate from a monosheet DTR imaging element, the imaging element is developed in an alkaline processing liquid subsequent to an image-wise exposure. Preferably, the obtained plate is subsequently stabilised using a stabilising liquid that reduces the surface pH of the plate after the alkaline development. An alkaline processing liquid generally comprises as active compounds, an inorganic alkali, a hydrophobizing agent, an inorganic sulphite and a silver halide solvent. Optionally, the alkaline processing liquid also comprises a developing agent. A stabilising liquid generally has a pH between 4 and 7, conveniently achieved with a buffer, and preferably also comprises a hydrophobizing agent.

A substantial waste of packaging, generally in plastic form, is generated by shipping the processing liquids in ready-to-use form thereby presenting an ecological disadvantage and causing inconvenience for customers using substantial volumes.

Accordingly, the need exists for bringing one or more processing liquids in a more concentrated and convenient form. In the past, proposals have been made to freeze-dry or spray-dry a processing liquid so that it can be shipped in a solid form and dissolved in e.g. water when needed. However, such procedure has the disadvantage of being expensive and moreover the lithographic printing plates that are obtained using a processing liquid including a hydrophobizing agent prepared by dissolving the solid have a bad performance particularly in terms of ink acceptance and printing endurance.

SUMMARY OF INVENTION

Accordingly it is an object of the present invention to provide a solution to the aforementioned problems.

Further objects of the present invention will become clear from the description hereinafter.

According to the present invention there is provided a kit for preparing a processing liquid for use in the preparation of a lithographic printing plate according to the silver salt diffusion transfer process, and comprising all necessary active compounds for preparing said processing liquid, said active compounds including a hydrophobizing agent being provided on the surface of solid particles, said solid particles being soluble in said processing liquid.

DETAILED DESCRIPTION

In accordance with the present invention it has been found that a processing liquid, including a hydrophobizing agent as an active compound, for use in the preparation of a printing plate according to the DTR process can be provided at least partially in solid form without impairing the printing properties of a printing plate prepared from a liquid obtained by dissolving such a solid. To achieve this, it is essential that the hydrophobizing agent is provided on the surface of solid particles that are soluble in the processing liquid.

Conveniently, the hydrophobizing agent can be provided on the surface of solid particles by spraying a solution of the hydrophobizing agent on the solid particles while such solid particles are air whirled. Preferably, the hydrophobizing agent is dissolved in a solvent that rapidly evaporates during spraying such as e.g. methanol or ethanol. Alternatively, the hydrophobizing agent can be dissolved in a solvent that does not substantially evaporates. However, in the latter case, a paste may be obtained which is less convenient for handling. Further, when the solvent does not evaporate, it should be selected such that it has no bad influence on the lithographic properties of a plate obtained from such a liquid. Solvents that do not substantially evaporate and that can be used in connection with this invention are e.g. polyols such as ethylene glycol, propylene glycol, glycerin etc.

The solid particles forming the carriers for the hydrophobizing agent, preferably comprise an active compound of the processing liquid. For example, such solid particles may comprise an inorganic salt e.g. a sulphite, a thiocyanate, a phosphate etc. Alternatively, the solid particles may comprise a compound that does not have a particular function in the processing liquid but that does not influence the printing properties of a printing plate obtained therefrom.

It is further a particular advantage of this invention that a kit can be prepared without the need of freeze-drying the processing liquid. Thus in accordance with the present invention the active compounds may be mixed together in their pure form with the proviso of course that the hydrophobizing agent is provided on a suitable solid carrier in accordance with the present invention.

According to a particular embodiment, the processing liquid to be prepared from a kit in connection with this invention, comprises an alkaline processing liquid. An alkaline processing liquid preferably includes at least an inorganic alkali, a silver halide solvent, a hydrophobizing agent and an inorganic sulphite such as e.g. potassium sulphite, sodium sulphite or ammonium sulphite as active compounds.

As inorganic alkali that may be used in connection with the present invention there are sodium hydroxide, potassium hydroxide, magnesium oxide, carbonates such as e.g. calcium carbonate etc. In addition to such inorganic alkali it may be convenient to include organic alkali such as e.g. alkanol amines that may function not only as alkali providers but also as silver halide solvents.

The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl containing at least 4 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

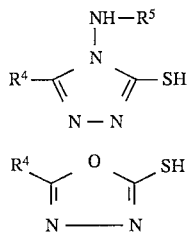

wherein $R^5$ represents hydrogen or an acyl group, $R^4$ represents alkyl, aryl or aralkyl. Most preferably used compounds are compounds according to one of the above formulas wherein $R^4$ represents an alkyl containing 4 to 16 C-atoms.

Further hydrophobizing agents for use in connection with the present invention correspond to the following formula:

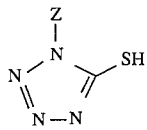 (A)

wherein Z represents a substituted or unsubstituted alkyl, a substituted or unsubstituted aryl, an aralkyl, an alkylaryl, a substituted or unsubstituted alkenyl, a substituted or unsubstituted alkynyl or a heterocyclic ring.

Specific examples of compounds according to the latter formula (A) are:

| compound no. | Z in formula (A) |
|---|---|
| H1 | $CH_2CONH$-n.$C_6H_{13}$ |
| H2 | $CH_2CON($n.$C_4H_9)_2$ |
| H3 | n.$C_6H_{13}$ |
| H4 | n.$C_8H_{17}$ |
| H5 | n.$C_4H_9$ |

Suitable silver halide solvents for use in connection with the present invention are e.g. thiocyanates, thiosulphates, thioethers as disclosed in e.g. U.S. Pat. No. 5,200,294. A particular preferred type of silver halide solvents are meso-ionic compounds such as e.g. a triazolium thiolate or tetrazolium thiolate. Highly preferred meso-ionic compounds correspond to the following formula:

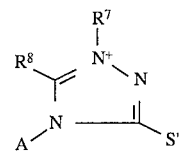

wherein $R^7$ and $R^8$ each independently represents an unsubstituted or substituted alkyl group, alkenyl group, cycloalkyl group, aralkyl group, aryl group or heterocyclic group, A represents an unsubstituted or substituted alkyl group, alkenyl group, cycloalkyl group, aralkyl group, aryl group, heterocyclic group or —$NR^9R^{10}$ and $R^9$ and $R^{10}$ each independently represents hydrogen, an alkyl group or aryl group and wherein $R^7$ and $R^8$ or $R^8$ and A or $R^9$ and $R^{10}$ can combine with each other to form a 5- or 6-membered ring.

The meso-ionic compounds are preferably used in combination with an alkanolamine. Alkanolamines that are suitable for use in accordance with the present invention may be of the tertiary, secundary or primary type. Examples of alkanolamines that may be used in connection with the present invention correspond to the following formula:

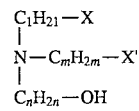

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

Further silver halide solvents that may be used in connection with the present invention are e.g. 2-mercaptobenzoic acid, cyclic imides and oxazolidones.

An alkaline processing liquid may further include other active compounds such as developing agents, calcium sequestering agents and development accelerators. Developing agents suitable for use in connection with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone.

According to a particularly preferred embodiment of the invention, a kit for preparing an alkaline processing liquid is provided composed of two or more parts that contain the active compounds and that are physically separated. One of these parts preferably contains the inorganic alkali in a solid form whereas the other part or parts contain the hydrophobizing agent and are substantially free from inorganic alkali.

A kit in accordance with the present invention is also suitable for preparing a stabilising liquid including a hydrophobizing agent (e.g. as mentioned above) and to be used in the making of a printing plate according to the DTR-process. A stabilising liquid generally has a pH between 5 and 7. A stabilising liquid preferably contains a buffer e.g. a phosphate buffer, a citrate buffer or mixture thereof and preferably an alkanol amine such as the alkanol amines listed above. The buffer capacity of a stabilising liquid is preferably such that the addition of 0.5 ml of a 1 molar aqueous sodium hydroxide solution to 50 ml of stabilising liquid does not increase the pH of the stabilising liquid above 6.5. A stabilising liquid can further contain bactericides, e.g. phenol, thymol or 5-bromo-5-nitro-1,3-dioxan as described in EP 0,150,517. A stabilising liquid can also contain substances which influence the hydrophobic/hydrophilic balance of the printing plate obtained after processing of the DTR element, e.g. silica. Further the stabilising liquid can contain wetting agents, and preferably compounds (wetting agents) containing perfluorinated alkyl groups.

Similar as disclosed above for a kit for preparing an alkaline processing liquid, a kit for preparing a stabilising liquid may be composed of two or more parts containing the active compounds of the stabilising liquid and being physically separated from each other. One or more of these parts may be in liquid form rather than solid form although the latter is highly preferred.

A processing liquid prepared from a kit in accordance with the present invention is suitable for preparing a lithographic printing plate from an imaging element according to the silver salt diffusion transfer process. Such imaging element preferably comprises on a support a silver halide emulsion layer and a physical development nuclei layer provided in that order. Optionally, a base layer or antihalation layer can be provided between the support and the silver halide emulsion layer.

According to a typical method for preparing a printing plate, an imaging element as described above is image-wise exposed, e.g. by camera or laser, and is subsequently developed using an alkaline processing liquid. Preferably, the alkaline development is followed by a stabilisation using a stabilising liquid that generally reduces the pH at the surface of the printing plate. Such method is disclosed in e.g. U.S. Pat. No. 5,200,294.

According to an alternative method, a printing plate may be obtained using an imaging element comprising on an aluminium support in the order given a layer containing physical development nuclei and a silver halide emulsion layer. After image-wise exposure such imaging element is developed using an alkaline processing liquid and is subsequently washed to remove the silver halide emulsion layer and other optional layers so as to expose a silver image formed in the layer containing the physical development nuclei. Such method is disclosed in e.g. EP-A 410,500.

The invention will now be illustrated by the following examples without however the intention to limit the invention thereto. All parts given are by weight unless otherwise specified.

EXAMPLE 1

Preparation of the Silver Halide Emulsion Coating Solution

A silver chlorobromide emulsion composed of 98.2mole% of chloride and 1.8 mole% of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized.

A base layer coating solution was prepared having the following composition:

| gelatin | 5.5% |
|---|---|
| carbon black | 0.76% |
| silica particles (5 μm) | 1.6% |

Preparation of the Imaging Element

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 g/m$^2$ and the gelatin content was 1.5 g/m$^2$. The emulsion layer further contained 0.15 g/m$^2$ of 1-phenyl-4-methyl-3-pyrazolidone and 0.25 g/m$^2$ of hydroquinone. The base layer was coated such that the amount of gelatin in the coated layer was 3 g/m$^2$.

The thus obtained element was dried and subjected to a temperature of 40° C. for 5 days and then the emulsion layer was overcoated with a layer containing PdS as physical development nuclei, hydroquinone at 0.4 g/m$^2$ and formaldehyde at 100 mg/m$^2$.

An alkaline processing liquid having the following composition was prepared:

| sodium hydroxide (g) | 30 |
|---|---|
| sodium sulphite anh. (g) | 33 |
| sodium thiocyanate (g) | 20 |
| glycerine (ml) | 3 |
| 2-mercapto-5-n.heptyl-oxa-3,4-diazole (mg) | 150 |
| EDTA sodium salt (g) | 1 |
| methylhydroquinone (g) | 1 |
| water to make | 1 liter |

The above alkaline processing liquid was prepared using one of the following kits:

(1) A kit of parts was used consisting of the following parts:
  (a) powdered sodium hydroxide being sprayed with glycerin (1 ml);
  (b) a mixture of sodium sulphite, sodium thiocyanate, EDTA, and methylhydroquinone in powdered form and being sprayed with a solution in ethanol of glycerin (2 ml) and 2-mercapto-5-n.heptyl-oxa-3,4-diazole (the hydrophobizing agent).

(2) A kit of parts was prepared consisting of the following parts:
  (a) powdered sodium hydroxide being sprayed with glycerin (1 ml):
  (b) a mixture of sodium sulphite, sodium thiocyanate, EDTA, methylhydroquinone and the hydrophobizing agent each in powdered form and being sprayed with glycerin (2ml).

The alkaline processing liquids were all prepared by first mixing part (a) into water and subsequent thereto part (b).

To prepare printing plates from the above described imaging element, the imaging element was image-wise exposed (camera exposure) and then developed using one of the alkaline processing liquids obtained from the 2 kit of parts disclosed above. Subsequent to this development, the plates were guided through a stabilising liquid having the following composition:

| | |
|---|---|
| citric acid | 10 g |
| sodium citrate | 35 g |
| cysteine | 1 g |
| sodium sulphite anh. | 5 g |
| phenol | 50 mg |
| water to make | 1 l |

The obtained printing plates were then used to print on a printing press using a commonly employed ink and an aqueous dampening liquid containing colloidal silica. The ink acceptance for each of the printing plates was evaluated. It was found that the alkaline processing liquid prepared from kit number 2 yielded printing plates that had a poor ink acceptance whereas the ink acceptance for the alkaline processing liquid from kit 1 was good.

EXAMPLE 2

Printing plates were prepared similar to the procedure of example 1 but with the exception that an alkaline processing liquid having the following composition was prepared:

| | |
|---|---|
| sodium hydroxide (g) | 31 |
| glycerin (ml) | 3 |
| sodium sulphite anh. (g) | 54 |
| compound A (see below) (g) | 0.8 |
| 2-mercapto-5-n.heptyl-oxa-3,4-diazole (mg) | 350 |
| EDTA sodium salt (g) | 1 |
| amino-ethyl-amino-ethanol (ml) | 45 |
| methylhydroquinone (g) | 2 |
| water to make | 1 liter |

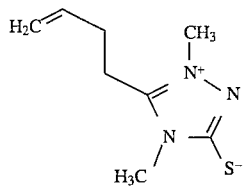

compound A

The above alkaline processing liquid was prepared using various kits of parts as follows:

(1) A kit of parts was used consisting of the following parts:
  (a) a mixture of sodium hydroxide (66 g), compound A (0.8 g), EDTA (1g) and methylhydroquinone (2 g), all in powdered form and sprayed with 1 ml of glycerin;
  (b) a mixture of solid amino-ethyl-aminoethanol/$H_2SO_3$ complex (mol ratio: 1/1) (80 g) and the hydrophobizing agent (350 mg) sprayed with 2 ml of glycerin.

(2) A kit of parts was used similar to kit no. 1 but with the exception that in part (b), the hydrophobizing agent was dissolved in 10 ml of ethanol together with the glycerin and sprayed on the amino-ethyl-amino-ethanol/$H_2SO_3$ complex.

Further, instead of the stabilising liquid disclosed in example 1, the following stabilising liquid was used:

| | |
|---|---|
| triethanol amine | 10 g |
| surfactant | 0.2 g |
| hydrophobizing agent no. H2 (see above) | 0.8 g |
| $NaH_2PO_4.2H_2O$ | 40 g |
| water to make | 1 liter |

It was found that the printing plate obtained using an alkaline processing liquid obtained from kit no. 1 had a poor ink acceptance whereas the alkaline processing liquid prepared from kit no. 2 yielded printing plates having a good ink acceptance. EXAMPLE 3

Printing plates were prepared similar as disclosed in example 2 using an alkaline processing liquid prepared from kit no. 2. The procedure of example 2 was modified in that the stabilising liquid was prepared by dissolving one of the following two kits in 1 liter of water:

(S1) A kit consisting of the following solid mixture:

| | |
|---|---|
| $NaH_2PO_4.2H_2O$ | 30 g |
| triethanolamine/$H_3PO_4$ solid complex (mol ratio: 1/1) | 16.6 g |
| surfactant | 0.2 g |
| hydrophobizing agent H2 (see above) | 0.8 g |
| citric acid.$H_2O$ | 4.2 g |
| (all solids were in powdered form and mixed) | |

(S2) A kit similar to kit S1 but with the modification that the hydrophobizing agent H2 was dissolved in 10 ml of ethanol and then sprayed on the solid mixture of the other compounds under air-whirling.

It was found that a printing plate obtained using a stabilising liquid obtained from kit S1 had a poor ink acceptance while in case of kit S2, the ink acceptance was good.

We claim:
1. A kit for preparing a processing liquid for use in the preparation of a lithographic printing plate according to the silver salt diffusion transfer process, and comprising all necessary active compounds for preparing said processing liquid, said active compounds including a hydrophobizing agent being provided on the surface of solid particles, said solid particles being soluble in said processing liquid.
2. A kit according to claim 1 wherein said solid particles comprise one or more further active compounds of said processing liquid.
3. A kit according to claim 1 wherein said solid particles comprise an inorganic salt.
4. A kit according to claim 1 for preparing a stabilising liquid capable of reducing the surface pH of a printing plate obtained subsequent to development.
5. A kit according to claim 1 for preparing an alkaline processing liquid.
6. A kit according to claim 1 wherein said active compounds are provided in two or more parts being physically separated.
7. A kit according to claim 6 wherein one or more of said parts are present in liquid form.
8. A method of using a kit as defined in claim 1 for preparing a processing liquid for the preparation of a lithographic printing plate according to the silver salt diffusion transfer process.

* * * * *

UNITED STATES PATENT AND TRADEMARK OFFICE
CERTIFICATE OF CORRECTION

PATENT NO. : 5,618,653
DATED : April 8, 1997
INVENTOR(S) : Vaes et al.

It is certified that error appears in the above-indentified patent and that said Letters Patent is hereby corrected as shown below:

Column 8, line 12, "EXAMPLE 3" should appear on the following line, as a heading.

Signed and Sealed this

Twenty-eighth Day of October, 1997

Attest:

BRUCE LEHMAN

Attesting Officer

Commissioner of Patents and Trademarks